(12) United States Patent
Pekny

(10) Patent No.: US 6,385,091 B1
(45) Date of Patent: May 7, 2002

(54) READ REFERENCE SCHEME FOR NON-VOLATILE MEMORY

(75) Inventor: Ted Pekny, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/846,936

(22) Filed: May 1, 2001

(51) Int. Cl.[7] .............................................. G11C 16/06
(52) U.S. Cl. ............................ 365/185.2; 365/230.06; 365/189.09
(58) Field of Search ..................... 365/185.2, 230.06, 365/189.09, 189.06, 185.21

(56) References Cited

U.S. PATENT DOCUMENTS

| | | |
|---|---|---|
| 5,568,426 A | 10/1996 | Roohparvar et al. |
| 5,675,540 A | 10/1997 | Roohparvar |
| 5,677,879 A | 10/1997 | Roohparvar et al. |
| 6,163,479 A | 12/2000 | Chevallier |
| 6,163,481 A | 12/2000 | Yamada et al. |
| 6,327,185 B1 * | 12/2001 | Hirata ..................... 365/185.2 |

* cited by examiner

*Primary Examiner*—David Nelms
*Assistant Examiner*—David Lam
(74) *Attorney, Agent, or Firm*—Scott Lundberg; Fogg Slifer Polglaze Leffert & Jay, P.A.

(57) ABSTRACT

A read reference scheme that uses current load matching on a reference word line path. In one embodiment, a flash memory device comprises a word line, a reference word line and a reference load circuit. The word line is coupled to a control gate of a memory cell. The reference word line is coupled to a control gate of a reference memory cell. In addition, the reference load circuit is coupled to the reference word line to approximately match a current load on the word line so a voltage level on the reference word line will be approximately equally to a voltage level on the word line during a read operation.

42 Claims, 8 Drawing Sheets

READ REFERENCE SCHEME FOR NON-VOLATILE MEMORY

TECHNICAL FIELD OF THE INVENTION

The present invention relates generally to non-volatile memories and in particular the present invention relates to a read reference scheme using current load matching on the reference word line path.

BACKGROUND OF THE INVENTION

Memory devices are typically provided as internal storage areas in the computer. One type of memory is a flash memory. A flash memory is a non-volatile memory. That is, a flash memory is a type of memory that retains data when its power source is removed. A typical flash memory comprises a memory array divided up into individually erasable sections or blocks of memory cells. The memory cells are arranged in a row and column fashion. Each memory cell includes a floating gate field-effect transistor capable of holding a charge. Moreover, each memory cell can be electrically programmed in a random basis by charging the floating gate. The charge can be removed from the floating gate by an erase operation. Thus, the data in a cell is determined by the presence or absence of the charge in the floating gate.

To program a memory cell, a high positive voltage such as 12 volts is applied to the control gate of the cell. In addition, a moderate positive voltage such as 6 to 9 volts is applied to the drain while the source voltage and the substrate voltage are at ground level. These conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to increase the effective threshold voltage of the cell as compared to a cell that has not been programmed. A programmed non-volatile memory cell is said to be at a logic level of "0". A block or section of memory cells is erased by putting a negative voltage on the word lines of an entire block and coupling the source connection of the entire block to Vcc (power supply), or higher. This creates a field that removes electrons from the floating gates of the memory elements. In an erased state, the memory cells can be activated using a lower control gate voltage. An erased non-volatile memory cell is said to be at a logic level of "1".

Verification of a non-volatile memory cell is accomplished by applying a potential to the control gate of the memory cell to be verified and then using a current sensing circuit or sense amplifier circuit to compare a current generated by the memory cell with a known current from a reference memory cell. The reference memory cell is generally a non-volatile memory cell or bit that has a predefined charge that is set or trimmed by the manufacture of the memory to produce a specific reference current. The reference cell is typically programmed to an intermediate state such that it conducts about half the current conducted by a fully programmed memory cell when an equivalent voltage level is applied to the control gates of the respective memory being read and reference memory cell. The reference memory cell is coupled to the sense amplifier circuit by a reference bit line line. Moreover, the memory cell that is being read is coupled to the sense amplifier circuit by a memory cell bit line.

To verify or read the state of a memory cell, a supply voltage is applied to a word line that is coupled to the control gate of the memory cell. At the same time, the same supply voltage is applied to a reference word line that is coupled to a control gate of the reference cell. The sense amplifier circuit then determines whether the memory cell to be read or verified draws more or less current than the reference current. By doing this, the sense amplifier circuit determines if the memory cell is in a programmed state or an erased state. However, a problem can occur in the prior art when differing current levels are drawn in a path between a voltage pump and word line verses a path between the voltage pump and the reference word line during a read or verify operation. A larger voltage drop from the supply voltage will occur in the path with the highest current load. This may cause a differential voltage to exist between the respective paths. Moreover, the differential may result in a reduction in the margin of current difference between the memory cell and the reference memory cell, which could reduce the accuracy of the sense amplifier circuit.

For the reasons stated above, and for other reasons stated below which will become apparent to those skilled in the art upon reading and understanding the present specification, there is a need in the art for an improved means of matching an active current in the voltage pump to word line path with the current in the voltage pump to reference word line path.

SUMMARY OF THE INVENTION

The above-mentioned problems with non-volatile memory devices and other problems are addressed by the present invention and will be understood by reading and studying the following specification.

In one embodiment, a flash memory device is disclosed comprising, a word line, a reference word line and a reference load circuit. The word line is coupled to a control gate of a memory cell. The reference word line is coupled to a control gate of a reference memory cell. The reference load circuit is coupled to the reference word line to approximately match a current load on the word line so the voltage level of the reference word line will be approximately equally to the voltage level on the word line during a read operation.

In another embodiment, a flash memory device comprises, a voltage pump, a non-volatile memory cell having a control gate, a x-decoder circuit, a word line, a non-volatile reference memory cell having a control gate, a reference word line and a reference load. The voltage pump is used to supply a read voltage. The word line is coupled to the control gate of the memory cell. The x-decoder circuit is used to selectively couple the voltage pump to the word line during a read operation of the memory cell. The reference word line is coupled between the voltage pump and a control gate of the reference memory cell. In addition, the reference load circuit is coupled to the reference word line to provide a current load that approximately matches a current load of the x-decoder circuit.

In another embodiment, a non-volatile memory device comprises, a memory array, a voltage read pump, a x-decoder circuit, a non-volatile reference memory cell, a reference word line, a reference load circuit and a current sensing circuit. The memory array has a plurality of sectors of non-volatile memory cells arranged in columns and rows. The voltage read pump is used to supply a read voltage supply. The x-decoder circuit selectively couples an output of the voltage read pump to an addressed word line during a read operation. The word line is coupled to a control gate of a selected memory cell. The reference word line is coupled between the voltage read pump and a control gate of the reference memory cell. The reference load circuit is coupled to the reference word line to provide a current load that approximately matches a current load of the x-decoder circuit during the read operation. The current sensing circuit is used to compare currents in an array bit line coupled to the selected memory cell with a reference bit line coupled to the reference memory cell.

In another embodiment, a non-volatile memory system is disclosed. The non-volatile memory system includes an external processor, a memory array, control circuitry, a plurality of word lines, a voltage read pump, a x-decode circuit, a reference memory cell, a reference word line, a reference load circuit and a current sensing circuit. The external processor provides external read commands. The memory array has a plurality of array sectors. Each array sector has a plurality of memory cells. The control circuitry is used to control read operations to the memory array. Moreover, the control circuitry is coupled to receive the external read commands from the external processor. The plurality of word lines are coupled to activate the memory cells in the array sectors. Moreover, each word line is coupled to a control gate of an associated memory cell. The voltage read pump is used to supply a read voltage. The x-decode circuit is used to selectively couple the read voltage to a word line of an addressed memory cell. In addition, the x-decode requires a current (Idecode) during a read operation. The reference memory cell provides a reference current. The reference word line is coupled between a control gate of the reference memory cell and the voltage read pump. The reference load circuit is coupled to the reference word line to provide a current load (Iload). Current Iload is approximately equal to Idecode. The current sensing circuit is used to compare currents in an array bit line coupled to the addressed memory cell with a current in a reference bit line coupled to the reference memory cell to determine the programmed state of the addressed memory cell.

In another embodiment, a method of operating a flash memory during a read operation is disclosed. The method comprising, coupling a read voltage to a word line, wherein the word line is coupled to a control gate of a non-volatile memory cell to be read, coupling the read voltage to a reference word line, wherein the reference word line is coupled to a control gate of a reference memory cell and coupling a current load to the reference word line to approximately match a current load on the word line.

In another embodiment, a method of operating a non-volatile memory is disclosed. The method comprising, coupling a read voltage to an x-decoder circuit to enable the x-decoder circuit to select an addressed word line during a read operation, coupling the read voltage to a reference word line and coupling a reference load circuit to the reference word line to approximately match a current draw through the x-decoder circuit during a read operation.

In yet another embodiment, a method of operating a flash memory is disclosed. The method comprising, coupling a first voltage to a plurality of switch circuits during a read operation, outputting a second voltage from one of the switch circuits to an internal data line in response to the first voltage, wherein the switch circuit is a switch circuit coupled to an array sector having a memory cell that is addressed to be read, activating a row driver circuit coupled to the internal data line with the second voltage, wherein the row driver circuit outputs a cell access voltage to a word line coupled to a control gate of the memory cell that is addressed to be read to activate the memory cell, activating a reference load circuit coupled to a pre-selected internal data line having the second voltage coupled thereon, wherein the reference load circuit produces a predetermined current load that approximately matches a current load of the row driver circuit, coupling the pre-selected internal data line to a reference word line coupled to a control gate of a reference cell, wherein a reference access voltage is coupled to the reference word line to activate the reference cell and sensing a marginal difference in an array bit line coupled to the memory cell addressed to be read and a reference bit line couple to the reference cell in determining the programmed state of the memory cell.

DETAILED DESCRIPTION OF THE INVENTION

In the following detailed description of the preferred embodiments, reference is made to the accompanying drawings, which form a part hereof, and in which is shown by way of illustration, specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention addresses a read reference scheme that improves reliability of a memory device in sensing the difference between a programmed bit and an erased bit. More specifically, the present invention approximately matches a current load in an array word line path during a read operation with the use of a reference load circuit coupled to a reference word line. Prior to describing the reference load circuit, a general description of one embodiment of the flash memory device of the present invention is described.

Figure 1:
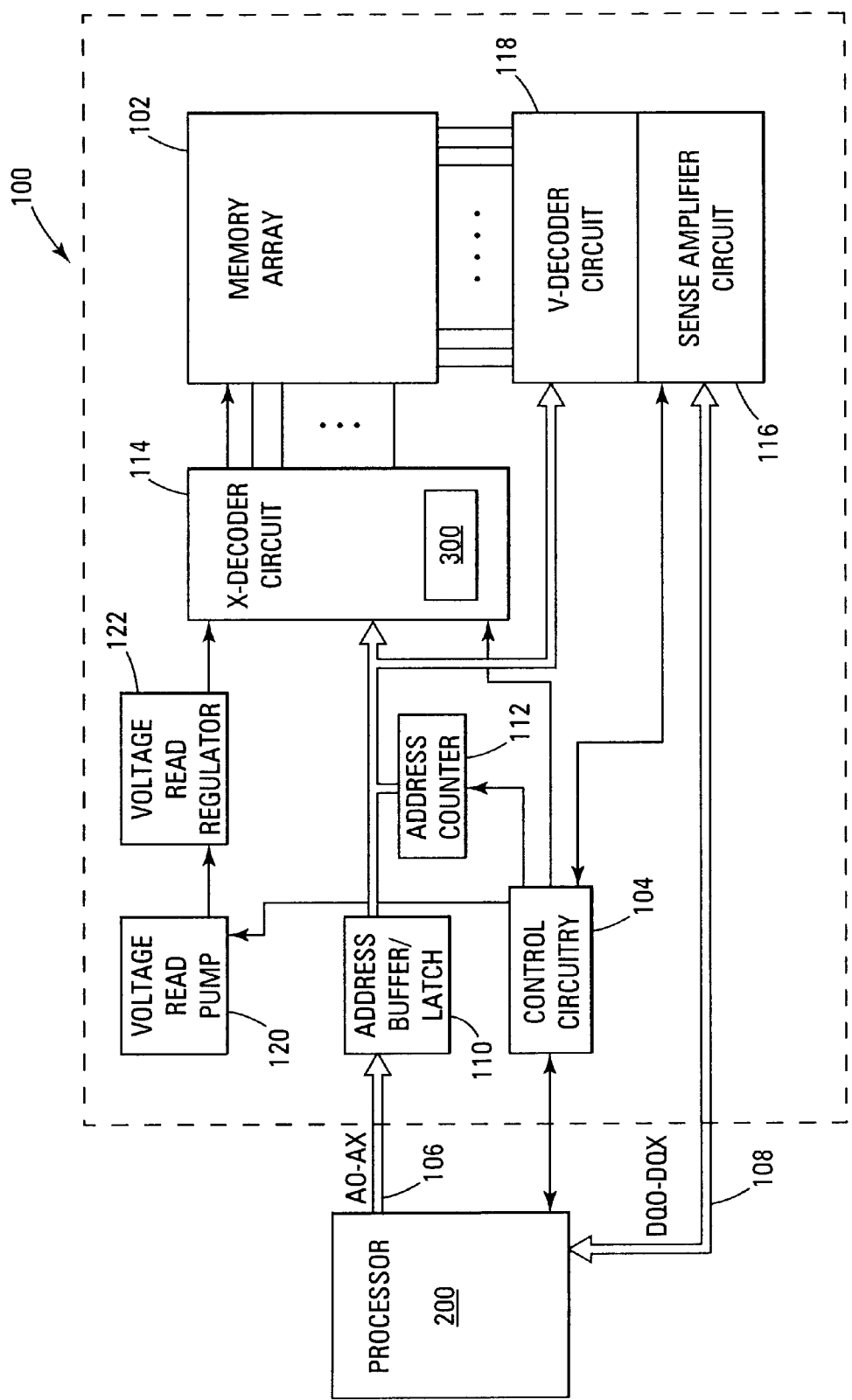
FIG. 1 is a block diagram of a non-volatile memory device according to one embodiment of the present invention.

Referring to FIG. 1, a simplified drawing of a flash memory device 100 illustrating the relevant components of one embodiment of the present invention is shown. As illustrated the flash memory device includes a memory array 102. The memory array 102 is made of non-volatile memory cells (cells) that are arranged in sectors. The flash memory device 100 also includes control circuitry 104 to control read, erase and other memory operation of the memory array 102. The control circuitry is coupled to an external processor

200 for operation and testing. Address lines (A0–Ax) 106 couple the external processor 200 to an address buffer/latch 110. The Address buffer/latch is coupled to an x-decoder circuit 114 and a y-decoder circuit 118. Moreover, an address counter 112 is couple between the control circuitry 104 and the x-decoder circuit 114 and the y-decoder circuit 118. A sense amplifier circuit 116 is coupled to memory array 102 to read accessed cells. Data lines (DQ0–DQx) 108 couple the sense amplifier circuit 116 to the external processor 200. Also illustrated, is a voltage read pump 120 to provide a read voltage and a voltage read regulator 122 to regulate the voltage to a predetermined value. A typical voltage value from the voltage read regulator is approximately 4.2 volts.

FIG. 1, further illustrates a reference load circuit 300 that is coupled to the x-decoder circuit 114. The reference load circuit 300 approximately matches a current load in a word line coupled to a cell being read with a current load in a reference word line coupled to a reference cell during a read operation by using a similarly matched transistor path. To better understand the reference load circuit 300, further background is first provided.

Figure 2:
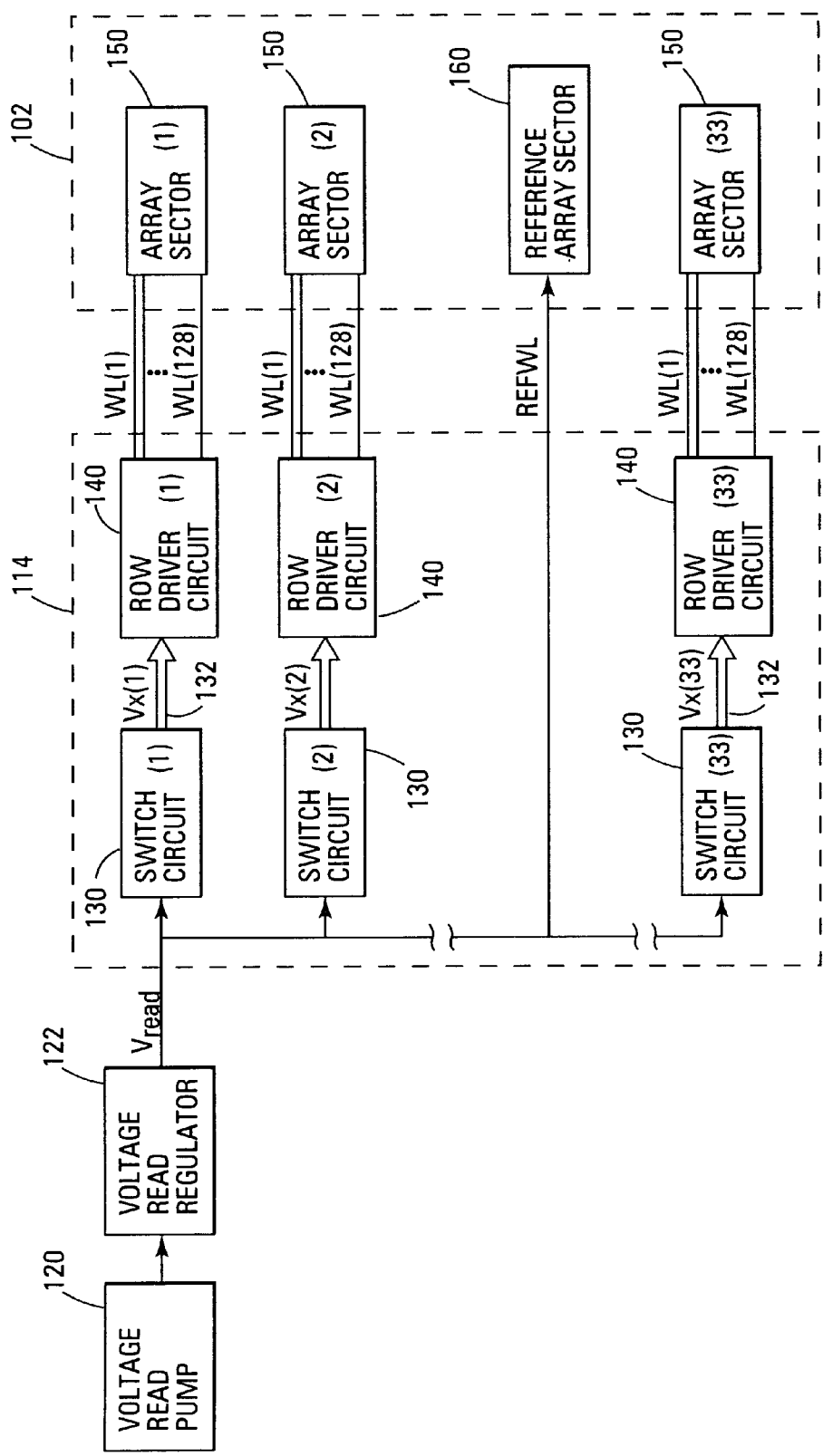
FIG. 2 is a block diagram of a read path in the prior art.

Referring to FIG. 2, a block read path of the prior art is illustrated. As illustrated, the voltage pump or voltage read pump 120 supplies a voltage to the voltage read regulator 122. An output of the voltage read regulator 122 is the read voltage or Vread voltage. This voltage is coupled to a plurality of switch circuits 130 in the x-decoder circuit 114. There is a switch circuit 130 for each array sector 150 in the memory array 102. Moreover, in this example of the prior art, there are thirty three switch circuits 130, thirty three row driver circuits 140 and thirty three array sectors 150. The switch circuits 130 output a word line voltage Vx (1–33) to be received by their associated array sector 150. For example during a read operation on a selected array sector 150, its associated switch circuit 130 outputs a positive word line voltage Vx on an internal data line 132 to access a selected cell. Moreover, during an erase operation of an array sector 150, the output of its associated switch circuit 130 will be at ground. The word line voltage Vx for one array sector 150 can be different from another array sector 150 so different operations (i.e. read or erase) can be performed on different array sectors 150 simultaneously.

Figure 3:
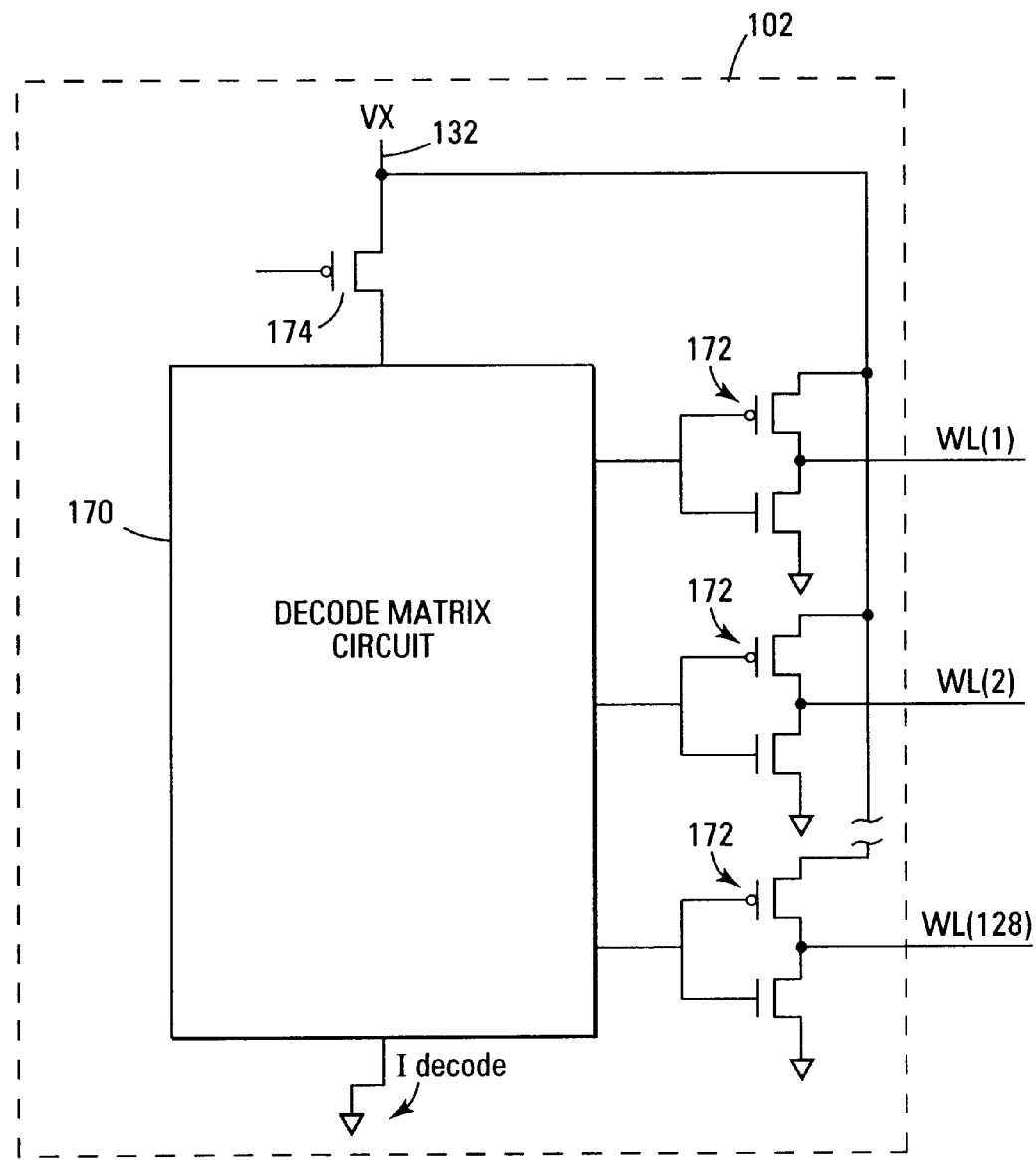
FIG. 3 is a schematic-block diagram of a row driver circuit of the prior art.

Each row driver circuit 140 receives the word line voltage Vx from an associated switch circuit 130. Referring to FIG. 3, a row driver circuit 140 is illustrated. As illustrated, each row driver circuit 140 contains a row driver 172 for each word line WL and a decode matrix circuit 170. In this example, each array sector 150 has one hundred twenty eight word lines WL. Accordingly, in this example, each row driver circuit 140 has one hundred twenty eight row drivers 172. The decode matrix code circuit 170 includes a tree matrix of decodes that point to a word line WL that has be selected. The decode matrix circuit 170 draws an active current (Idecode) from an interior data line 132 having voltage Vx, in pointing to the word line WL selected. Moreover, only one word line WL per array sector 150 is pointed to or selected by the decode matrix circuit 170 at a time. When a cell in an array sector 150 is to be read an active low logic signal is applied to p-channel transistor 174. The active current Iload then activates the decode matrix circuit 170. The decode matrix circuit 170 then sends an active low logic signal to the row driver 172 associated with the word line WL selected. An activation voltage is then applied to the word line WL selected, to activate the selected cell. The activation voltage can be referred to as the cell access voltage. Since, decode matrix circuits 170 are common in the art, a detailed description of their operation is not provide herein.

Figure 4:
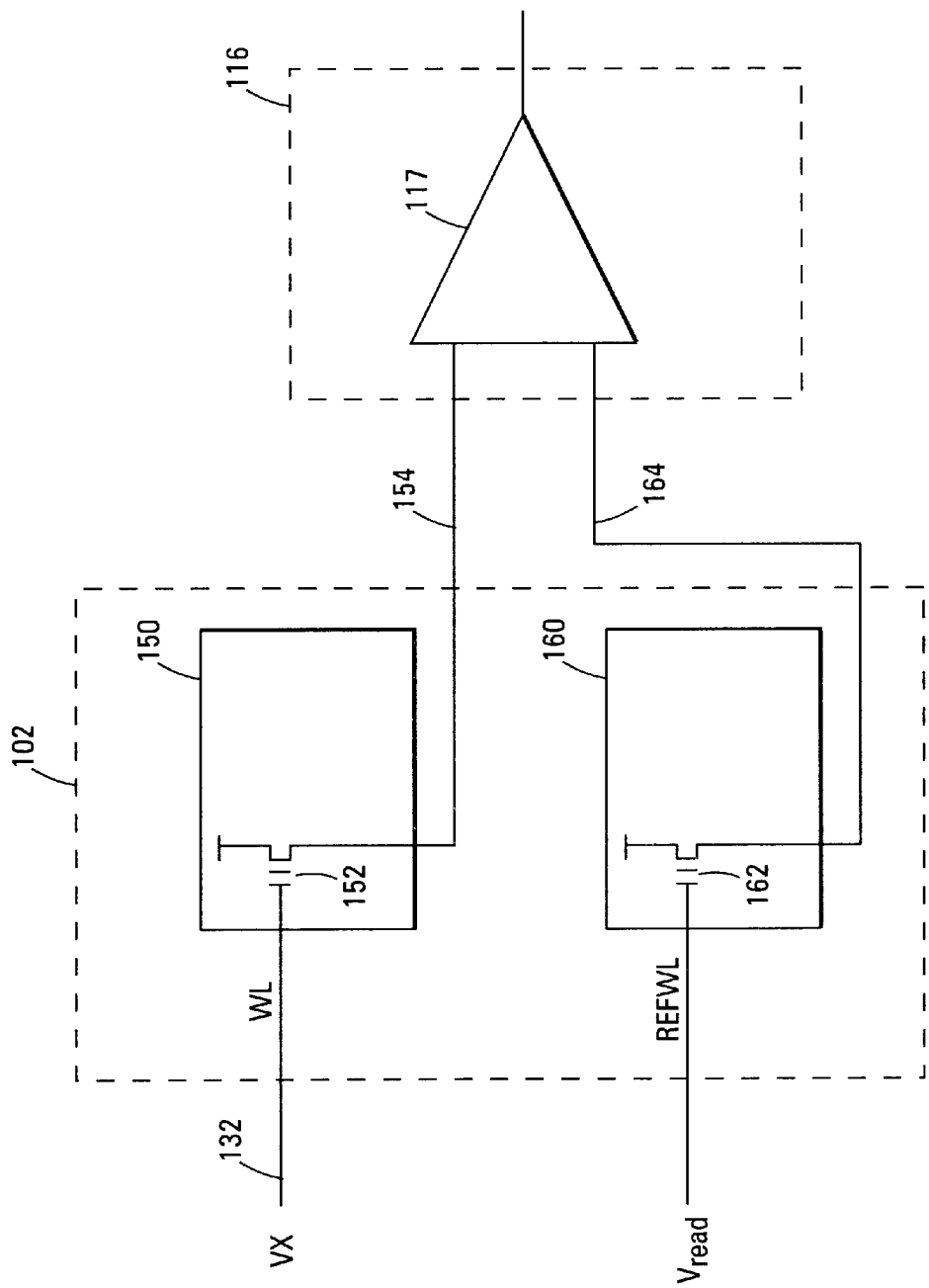
FIG. 4 is block diagram illustrating how a memory cell is read in the prior art.

Referring back to FIG. 2, the memory array 102 is shown having a reference array sector 160. The reference array sector 160 is sometime referred to as a "mini" array and is where a reference cell is located. During a read operation, voltage Vread, from the voltage read regulator, is coupled to the reference word line (REFWL) to activate a reference memory cell. Referring to FIG. 4, a simplified illustration of the memory array 102 having a cell 152 to be read and the sense amplifier circuit 116 having a sense amplifier 117 is shown of the prior art. FIG. 4 illustrates how a cell 152 in an array sector 150 is read. Voltage Vx is applied to a control gate of cell 152 to activate cell 152. More specifically, the cell access voltage is applied to the control gate of the cell to be read. This accounts for the current drain by the row driver circuit 140 on the interior data line 132. Moreover, as stated above, voltage Vread is applied to a control gate of reference cell 162 at the same time to activated the reference cell 162. Thereafter, the sense amplifier 117 in the sense amplifier circuit 116 compares current in a reference bit line 164 created by the reference cell 162 with current in a array bit line 154 from the selected cell 152 in determining the program state of the cell 152. The greater the margin of difference between the reference bit line 164 and the array bit line 154, the more accurate the output of the sense amplifier 117. Moreover, since a current in a bit line coupled to a cell is proportional to the difference between the voltage on a control gate of the cell and the threshold voltage of the cell, it is desired to apply voltages that are approximately the same to the control gates of the cell to be read and the reference cell to get an accurate margin differential.

Figure 5:
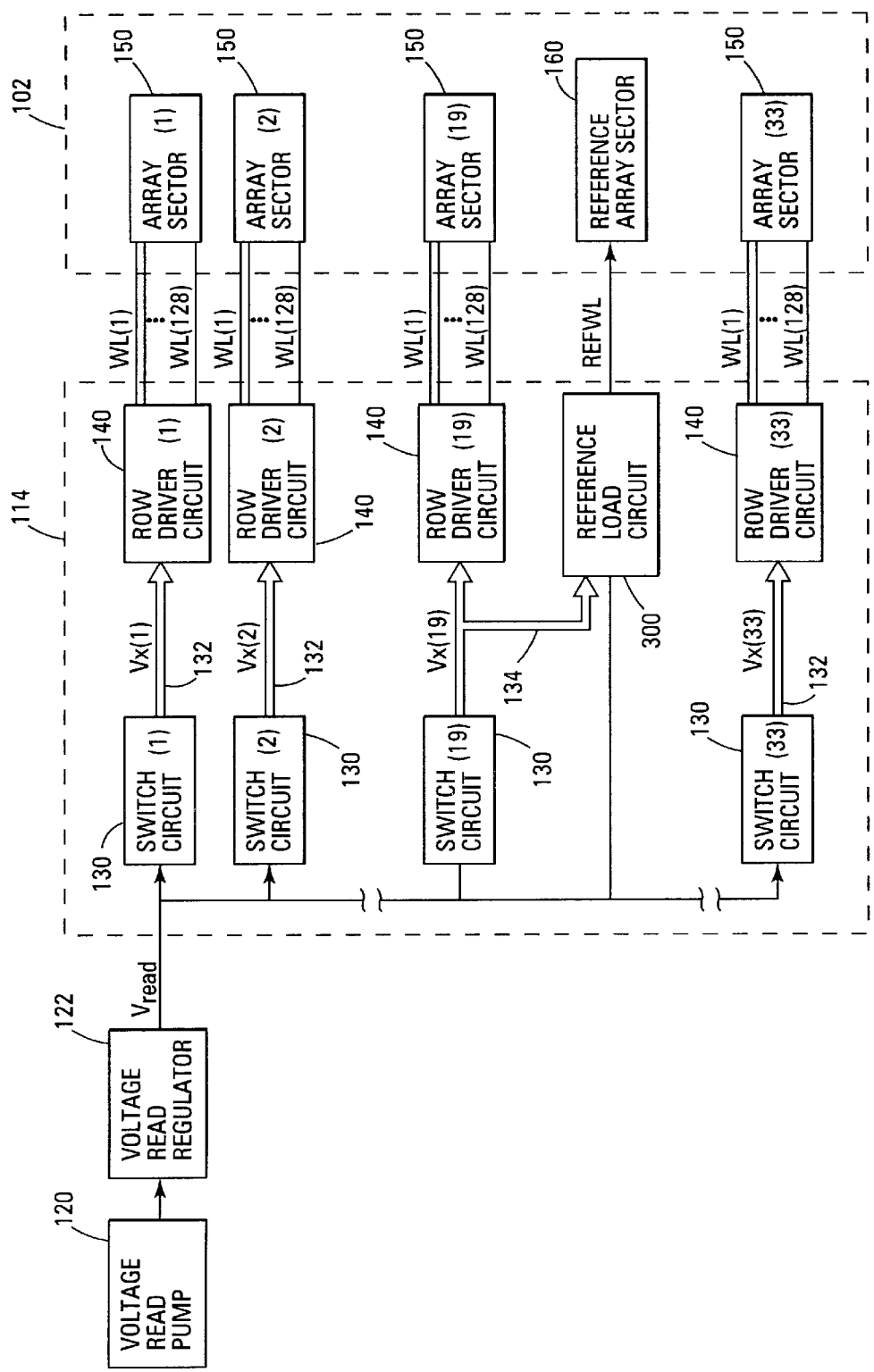
FIG. 5 is block diagram of a read path of one embodiment of the present invention.

Referring to FIG. 5, a block read path of one embodiment of the present invention is illustrated. As illustrated, the reference load circuit 300 is coupled between a pre-selected interior data line 134 having voltage Vx(19) and the reference word line REFWL. The pre-selected interior data line 134 with voltage Vx(19) is used because, in this embodiment, array sector (19) 150 is the array sector 150 that is the closest to the reference array sector 160. That is, the pre-selected interior data line 134 with the voltage Vx(19) is used because of its location. However, it will be recognized in the art that the reference load circuit 300 could be coupled to any of the interior data lines with a voltage signal of Vx and that the present invention is not limited to coupling the reference load circuit 300 to the pre-selected interior data line 134 with the voltage Vx(19). Moreover, it will be recognized by those in the art that although the present invention is illustrated with thirty three switch circuits 130, thirty three row driver circuits 140, thirty three array sectors 150 and 128 word lines WL for each array sector 150, other amounts of switch circuits 130, row drivers circuits 140, array sectors and word lines WL could be used and that the present invention is not limited to the aforementioned amounts.

Figure 6:
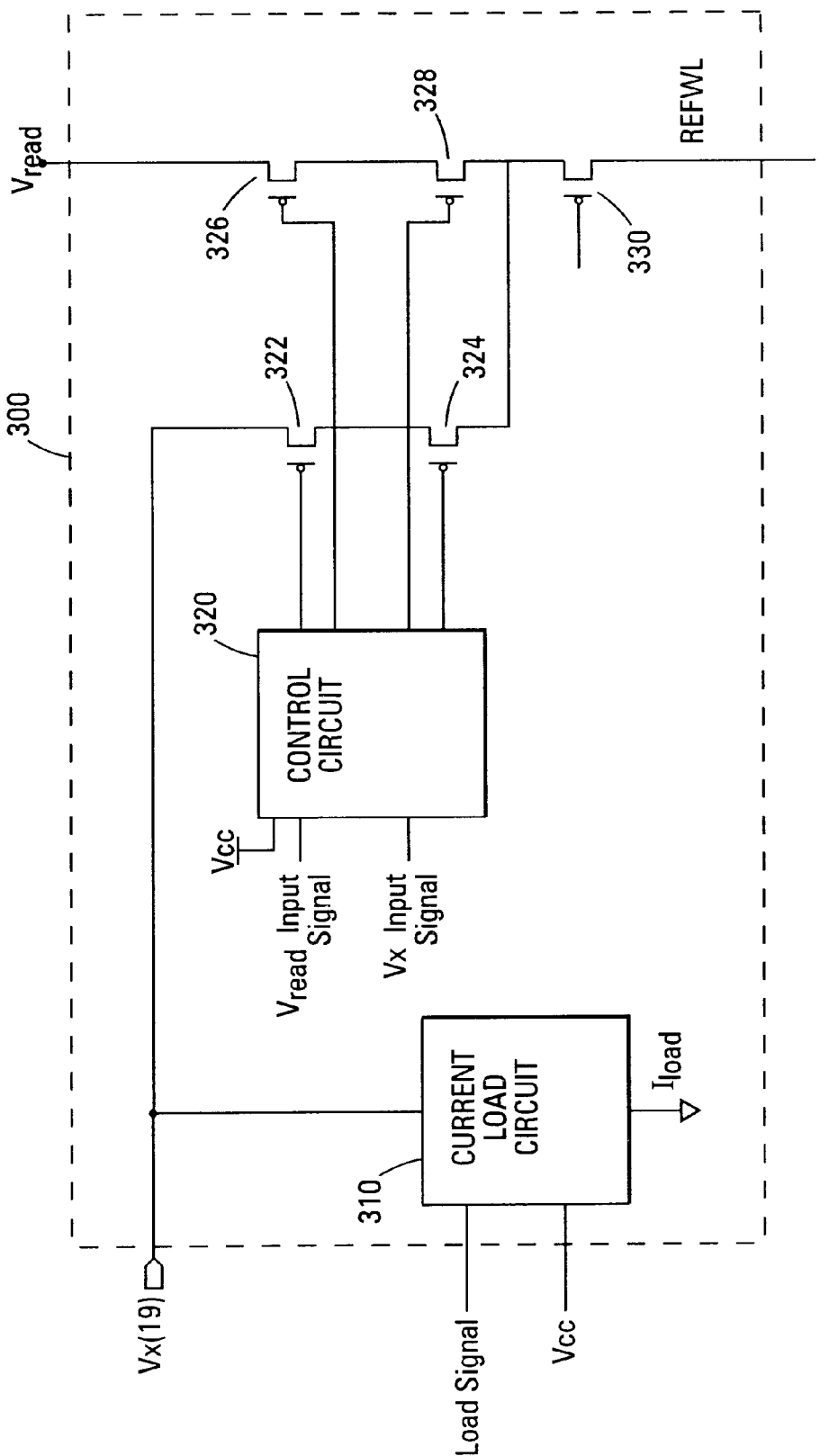
FIG. 6 is schematic-block diagram of one embodiment of the reference load circuit of the present invention.

Referring to FIG. 6, a drawing illustrating one embodiment of a reference load circuit 300 is shown. The reference load circuit 300 approximately replicates the current Idecode draw during a read operation with a current Iload so the voltage applied to the reference word line REFWL approximately matches the voltage in word line WL that is coupled to a cell being read. As shown, in this embodiment, the reference load circuit 300 includes a current load circuit 310, a control circuit 320, and five p-channel transistors 322, 324, 326, 328 and 330. P-channel transistor 330 is a pass-through transistor that selectively couples voltage signals to the reference word line REFWL.

The control circuit 320 is a circuit that selectively couples either voltage Vx(19) or voltage Vread to the reference word line REFWL by activating respective p-channel transistors 322 and 324 or 326 and 328. More specifically, control circuit 320 couples either a voltage that approximately matches the cell access voltage applied to a word line that is coupled to a cell to be read or a voltage Vread. The voltage coupled to the reference word line REFWL that approximately matches the cell access voltage can be referred to as a reference access voltage. A Vread input signal is selectively coupled to an input of the control circuit 320. When the Vread input signal is activated, the control circuit 320 sends an active low logic signal to activate p-channel transistors 326 and 328. P-channel transistors 326 and 328 can be referred to as second p-channel transistors. This couples voltage Vread to the reference word line REFWL. Voltage Vread is used, in this embodiment, as a default voltage for the reference word line REFWL before an actual read operation begins. In addition, a Vx(19) input signal is also selectively coupled to another input of the control circuit 320. When the Vx (19) input signal is activated, the control circuit 320 sends an active low logic signal to activate p-channel transistors 322 and 324. P-channel transistors 322 and 324 can be referred to as first p-channel transistors. This couples voltage Vx(19) to the reference word line REFWL. The Vx input signal is coupled to the control circuit 320 during a read operation and during erase verify (when a cell is being read to determine if it is in an erased state). Moreover, a voltage source Vcc is coupled to the control circuit 320.

Figure 7:
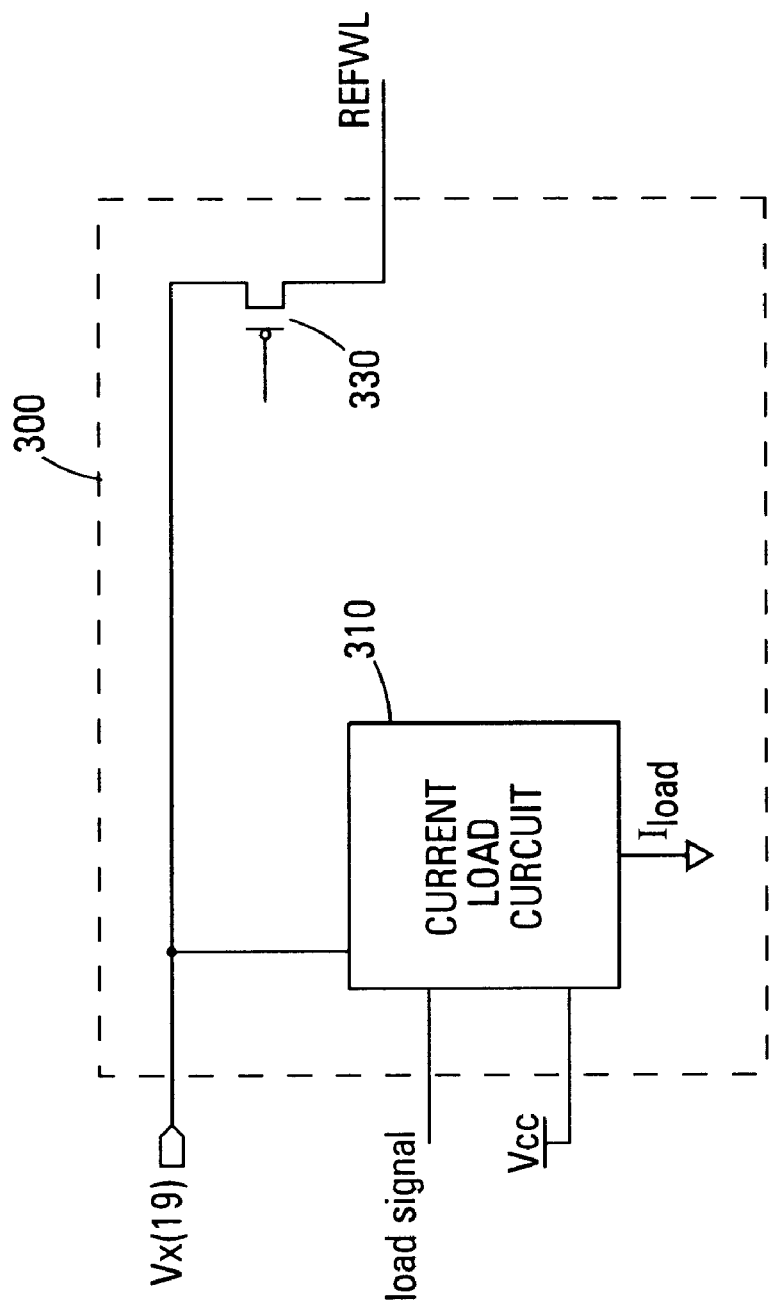
FIG. 7 is a schematic-block diagram of another embodiment of the reference load circuit.

Another embodiment of the reference load circuit 300 is illustrated in FIG. 7. As FIG. 7 illustrates, this embodiment has a current load circuit 310 and a P-channel pass-through transistor 330 that selectively couples the pre-selected interior data line 134 to the reference word line REFWL. In this embodiment, a control circuit is not used because voltage Vread is not selectively coupled to the reference word line REFWL.

Figure 8:
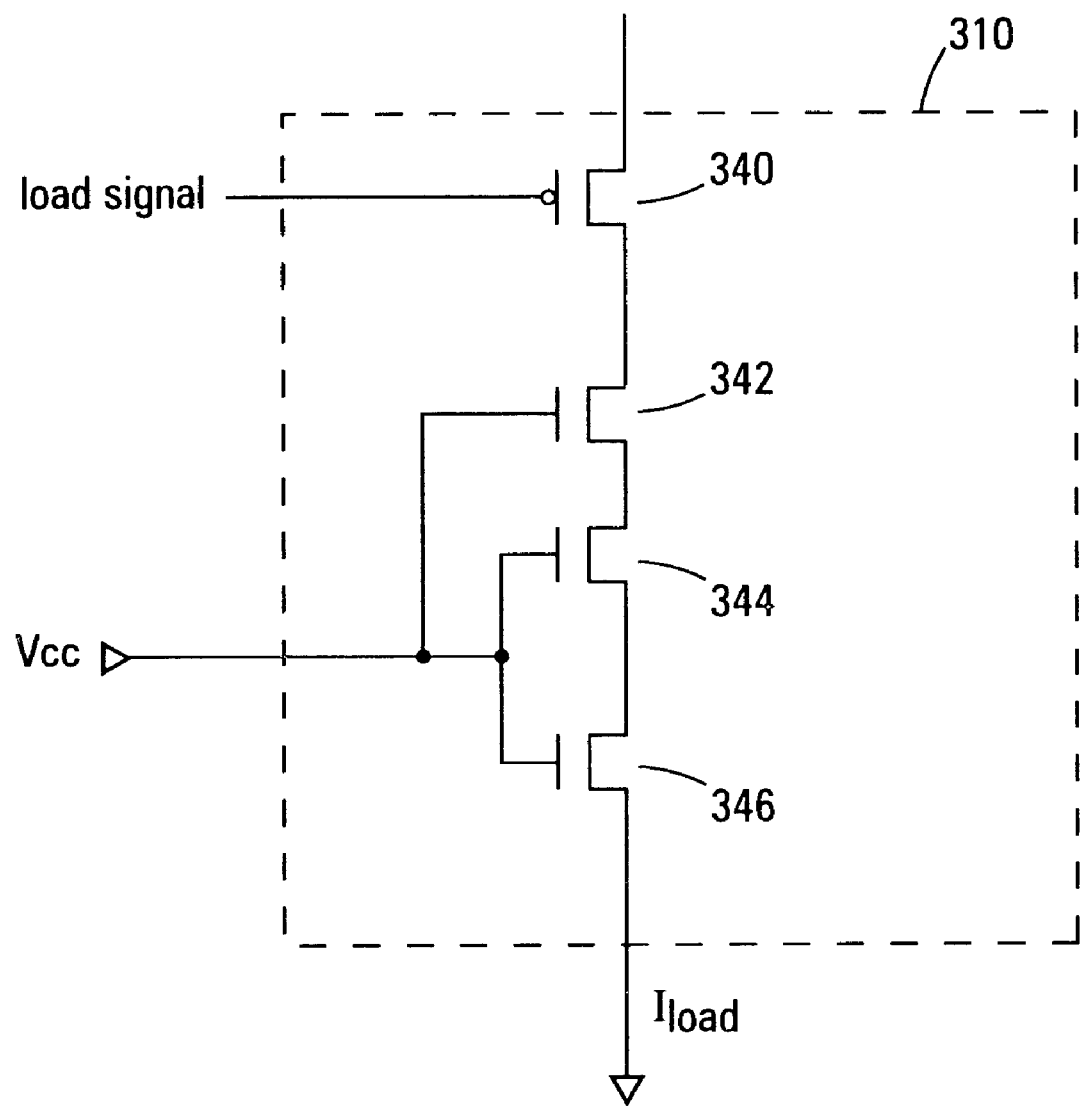
FIG. 8 is a schematic diagram of one embodiment of the current load circuit of the present invention.

Referring to FIG. 8, one embodiment of the current load circuit 310 is illustrated. In this embodiment, the current load circuit 310 includes three n-channel transistors 342, 344, and 346 coupled in series and a p-channel transistor 340. The three n-channel transistors 342, 344 and 346 are pre-selected to approximately replicate the transistor path in the tree matrix of decodes that point to a word line WL that is coupled to a cell that is selected to be read. The gates of the n-channel transistors 342, 344 and 346 are coupled to a voltage source Vcc. The p-channel transistor 340 turns the current load matching circuit on and off. Coupling an active low logic signal to the gate of p-channel transistor 340 turns the load matching circuit on. Moreover, the active low logic signal is coupled to the gate of the p-channel transistor during a read or verify operation.

When the current load matching circuit 310 is activated, a current Iload passes through the current load matching circuit 310. Current Iload approximately matches current Idecode going though a decode matrix circuit 170 that is used to point to the word line having the cell to be read. Because the current drain of current Iload and current Idecode approximately matches, the voltage on the reference word line REFWL approximately matches the voltage on the word line WL that is coupled to the cell being read. Thus, the voltage applied to the control gate of the reference cell will be approximately equal to the voltage applied to the control gate of the memory cell being read.

CONCLUSION

A read reference scheme that uses current load matching on a reference word line path has been disclosed. In one embodiment, a flash memory device comprises a word line, a reference word line and a reference load circuit. The word line is coupled to a control gate of a memory cell. The reference word line is coupled to a control gate of a reference memory cell. In addition, the reference load circuit is coupled to the reference word line to approximately match a current load on the word line so a voltage level on the reference word line will be approximately equally to a voltage level on the word line during a read operation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:
   a word line coupled to a control gate of a memory cell;
   a reference word line coupled to a control gate of a reference memory cell; and
   a reference load circuit coupled to the reference word line to approximately match a current load on the word line, wherein the voltage level of the reference word line is approximately equally to the voltage level on the word line during a read operation.

2. The flash memory device of claim 1 further comprising:
   a decode matrix circuit selectively coupled to the word line to select the word line, wherein the decode matrix produces the current load on the word line.

3. The flash memory device of claim 1 wherein the reference load circuit comprises:
   an interior data line to selectively couple a predefined voltage to the reference word line; and
   a current load circuit coupled to the interior data line to provide the load current.

4. The flash memory device of claim 3 wherein the interior data line is selectively coupled to the reference word line by a p-channel pass-through transistor.

5. The flash memory device of claim 3 wherein the current load circuit comprises:
   a p-channel transisitor that is selectively activated during a read operation; and
   at least one n-channel transistor coupled in series with the p-channel transistor, a gate of the at least one n-channel transistors is coupled to a voltage supply, wherein the at least one n-channel transistor is pre-selected to conduct a given current.

6. The flash memory device of claim 3 wherein the current load circuit comprises:
   a p-channel transistor that is selectively activated during a read operation; and
   a plurality of n-channel transistors coupled in series with the p-channel transistor, gates of the n-channel transistors are couple to a voltage supply, wherein the n-channel transistors are pre-selected to conduct a given current.

7. A flash memory device comprising:
   a voltage pump to supply a read voltage;
   a non-volatile memory cell having a control gate;
   a word line coupled to the control gate of the memory cell;
   a x-decoder circuit to selectively couple the voltage pump to the word line during a read operation of the memory cell;

a non-volatile reference memory cell having a control gate;

a reference word line coupled between the voltage pump and a control gate of the reference memory cell; and a reference load circuit coupled to the reference word line to provide a current load that approximately matches a current load of the x-decoder circuit.

8. The flash memory device of claim 7 further comprising:

a sense amplifier coupled to the memory cell and the reference memory cell to determine the program state of the memory cell.

9. The flash memory device of claim 7 wherein the x-decoder circuit comprises:

a decode matrix circuit to selectively point to the memory cell; and a row driver to selectively couple the read voltage to the word line coupled to the memory cell.

10. The flash memory device of claim 7 wherein the reference load circuit comprises:

a current load circuit to provide the current load; and a p-channel pass through transistor to selectively couple the read voltage to the reference word line.

11. The flash memory device of claim 10 where the current load circuit comprises:

a p-channel transistor to activate the current load circuit; and at least one n-channel transistor coupled in series with the p-channel transistor, a gate of the at least one n-channel transistor is coupled to a voltage supply, wherein the at least one n-channel transistor is pre-selected to conduct a given current.

12. The flash memory device of claim 7 wherein the x-decoder comprises:

a switch circuit coupled to the voltage pump to output a word line voltage to an internal data line during a read operation of the memory cell, wherein the internal data line is selectively coupled to the reference word line.

13. The flash memory of claim 12 wherein the reference load circuit comprises:

a current load circuit coupled to the internal data line to provide a current load;

at least one first p-channel transistor coupled between the internal data line and the reference word line;

at least one second p-channel transistor coupled between the voltage pump and the reference word line; and a control circuit to selectively activate the at least one first p-channel transistor and the at least one second p-channel transistor, wherein the control circuit activates the at least one first p-channel transistor during a read operation and the at least one second transistor prior to a read operation.

14. A non-volatile memory device comprising:

a memory array having a plurality of sectors of non-volatile memory cells arranged in columns and rows;

a voltage read pump to supply a read voltage supply;

a x-decoder circuit to selectively couple an output of the voltage read pump to an addressed word line during a read operation, wherein the word line is coupled to a control gate of a selected memory cell;

a non-volatile reference memory cell;

a reference word line coupled between the voltage read pump and a control gate of the reference memory cell;

a reference load circuit coupled to the reference word line to provide a current load that approximately matches a current load of the x-decoder circuit during the read operation; and a current sensing circuit to compare currents in an array bit line coupled to the selected memory cell with a reference bit line coupled to the reference memory cell.

15. The non-volatile memory device of claim 14 wherein the reference load circuit comprises:

a plurality of transistors coupled to match a transistor path of the x-decoder circuit.

16. The non-volatile memory device of claim 14 further comprising:

a voltage regulator coupled between the voltage read pump and the x-decoder circuit.

17. The non-volatile memory device of claim 14 wherein the x-decoder further comprises:

a row driver circuit for each sector of the memory array to point to an addressed word line, the row driver providing a current load; and a switch circuit for each sector of the memory array to selectively couple a word line voltage to an associated row driver circuit.

18. The non-volatile memory device of claim 17 wherein the reference load circuit comprises:

a current load circuit coupled to one of the switch circuits of the x-decoder, wherein the current load circuit provides a current load that approximately matches the current load of the row driver; and a control circuit to selectively couple the word line voltage and a voltage from the voltage read pump to the reference word line, wherein the word line voltage is coupled to the reference word line during a read operation and the voltage from the voltage read pump is coupled to the reference word line before the read operation.

19. The non-volatile memory device of claim 18 wherein the control circuit selectively activates an at least one first p-channel transistor in coupling the word line voltage to the reference word line and an at least one second p-channel transistor in coupling the voltage read pump to the reference word line.

20. The non-volatile memory device of claim 18 further wherein the reference load circuit comprises:

a p-channel pass-through transistor to selectively couple the reference load circuit to the reference word line.

21. A non-volatile memory system comprising:

an external processor to provide external read commands;

a memory array having a plurality of array sectors, wherein each array sector has a plurality of memory cells;

control circuitry to control read operations to the memory array, the control circuitry coupled to receive the external read commands from the external processor;

a plurality of word lines coupled to activate the memory cells in the array sectors, wherein each word line is coupled to a control gate of an associated memory cell;

a voltage read pump to supply a read voltage;

a x-decode circuit to selectively couple the read voltage to a word line of an addressed memory cell, wherein the x-decode requires a current (Idecode) during a read operation;

a reference memory cell to provide a reference current;

a reference word line coupled between a control gate of the reference memory cell and the voltage read pump;

a reference load circuit coupled to the reference word line to provide a current load (Iload), wherein Iload is approximately equal to Idecode; and a current sensing circuit to compare currents in an array bit line coupled to the addressed memory cell with a current in a reference bit line coupled to the reference memory cell to determine the programmed state of the addressed memory cell.

22. The non-volatile memory system of claim 21 further comprising:

a voltage read regulator coupled to the voltage read pump to regulate the read voltage to a predefined voltage level.

23. The non-volatile memory system of claim 21 wherein the x-decode circuit comprises:

a switch circuit for each array sector to output a word line voltage during a read operation to a memory cell in an associated array sector;

a row driver circuit for each array sector to selectively couple the word line voltage to an addressed word line; and an interior data line for each row driver circuit, each interior data line coupled between one of the switch circuits and an associated row driver to couple the word line voltage to the associated row driver.

24. The non-volatile memory system of claim 23 wherein the row driver comprises:

a decode matrix circuit to decode an address request; and a row driver for each word line, wherein the decode matrix activates the row driver coupled to the addressed word line.

25. The non-volatile memory system of claim 23 wherein the reference load circuit comprises:

a current load circuit coupled to a pre-selected interior data line, wherein the current load circuit conducts Iload; and a p-channel pass-through transistor to selectively couple the reference word line to the pre-selected interior data line.

26. The non-volatile memory system of claim 25 wherein the current load circuit comprises:

a plurality of transistors coupled to match a transistor path of the x-decoder circuit.

27. The non-volatile memory system of claim 25 wherein the current load circuit comprises:

a p-channel transistor that is selectively activated during a read operation; and a plurality of n-channel transistors coupled in series with the p-channel transistor, gates of the n-channel transistors are couple to a voltage supply, wherein the n-channel transistors are pre-selected to conduct Iload.

28. The non-volatile memory system of claim 23 wherein the reference load circuit comprises:

a current load circuit coupled to a pre-selected interior data line, wherein the current load circuit conducts Iload;

at least one first p-channel transistor to selectively couple the word line voltage to the reference word line;

at least one second p-channel transistor to selectively couple the read voltage to the reference word line; and control circuitry to selectively activate the at least one first p-channel transistor and the at least one second p-channel transistor, wherein the control circuitry activates the at least one first p-channel transistor during a read operation and the at least one second p-channel transistor prior to a read operation.

29. The non-volatile memory system of claim 28 wherein the reference load circuit further comprises:

a p-channel pass-through transistor to selectively couple the reference word line to the reference load circuit.

30. A method of operating a flash memory during a read operation comprising:

coupling a read voltage to a word line, wherein the word line is coupled to a control gate of a non-volatile memory cell to be read;

coupling the read voltage to a reference word line, wherein the reference word line is coupled to a control gate of a reference memory cell; and coupling a current load to the reference word line to approximately match a current load on the word line.

31. The method of claim 30 further comprising:

sensing a current margin differential between an array bit line coupled to the memory cell to be read and a reference bit line coupled to the reference memory cell to determine the programmed state of the memory cell to be read.

32. The method of claim 30 further comprising:

coupling the read voltage to a x-decoder circuit to select the word line coupled to the memory cell to be read, wherein the x-decoder circuit produces the current load in the word line.

33. The method of claim 30 wherein a voltage applied to the control gate of the memory cell to be read is approximately equal to the voltage applied to the control gate of the reference memory cell.

34. A method of operating a non-volatile memory comprising:

coupling a read voltage to a x-decoder circuit to enable the x-decoder circuit to select an addressed word line during a read operation;

coupling the read voltage to a reference word line; and coupling a reference load circuit to the reference word line to approximately match a current draw through the x-decoder circuit during a read operation.

35. The method of claim 34 further comprising:

activating a control gate of a memory cell addressed to be read with a first voltage on the word line; and activating a control gate of a reference memory cell with a second voltage on the reference word line, wherein the first and second voltage level is approximately equal.

36. The method of claim 34 farther comprising:

comparing a bit line current from a selected memory cell with a bit line current of a reference memory cell in determining the program state of the selected memory cell.

37. The method of claim 34 wherein the reference load circuit approximately matches a transistor path in the x-decoder circuit.

38. The method of claim 34 wherein coupling the reference load to the reference word line further comprises:

coupling the read voltage to an internal data line of the reference load circuit;

coupling a transistor path to the internal data line that approximately matches the transistor path of the x-decoder circuit; and selectively coupling the interior data line to the reference word line during a read operation.

39. A method of operating a flash memory, the method comprising:

coupling a first voltage to a plurality of switch circuits during a read operation;

outputting a second voltage from one of the switch circuits to an internal data line in response to the first voltage, wherein the switch circuit is a switch circuit coupled to an array sector having a memory cell that is addressed to be read;

activating a row driver circuit coupled to the internal data line with the second voltage, wherein the row driver circuit outputs a cell access voltage to a word line coupled to a control gate of the memory cell that is addressed to be read to activate the memory cell;

activating a reference load circuit coupled to a pre-selected internal data line having the second voltage coupled thereon, wherein the reference load circuit produces a pre-determined current load that approximately matches a current load of the row driver circuit;

coupling the pre-selected internal data line to a reference word line coupled to a control gate of a reference cell, wherein a reference access voltage is coupled to the reference word line to activate the reference cell; and sensing a marginal difference in an array bit line coupled to the memory cell addressed to be read and a reference bit line couple to the reference cell in determining the programmed state of the memory cell.

40. The method of claim 39 wherein the first voltage is a read voltage and the second voltage is a word line voltage.

41. The method of claim 39 further comprising:

coupling the first voltage to the reference word line prior to the read operation.

42. The method of claim 39 wherein the cell access voltage is approximately equal to the reference access voltage.

* * * * *